United States Patent
Li et al.

(10) Patent No.: US 12,159,682 B2
(45) Date of Patent: Dec. 3, 2024

(54) MULTI-LEVEL CELLS, AND RELATED ARRAYS, DEVICES, SYSTEMS, AND METHODS

(71) Applicant: Micron Technology, Inc., Boise, ID (US)

(72) Inventors: Jiyun Li, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/805,090

(22) Filed: Jun. 2, 2022

(65) Prior Publication Data

US 2023/0395101 A1 Dec. 7, 2023

(51) Int. Cl.
*G11C 7/08* (2006.01)
*G11C 7/10* (2006.01)
*G11C 7/14* (2006.01)

(52) U.S. Cl.
CPC .............. *G11C 7/08* (2013.01); *G11C 7/1069* (2013.01); *G11C 7/1096* (2013.01); *G11C 7/14* (2013.01)

(58) Field of Classification Search
CPC ....... G11C 7/08; G11C 7/1069; G11C 7/1096; G11C 7/14
USPC ................................................... 365/189.09
See application file for complete search history.

(56) References Cited

U.S. PATENT DOCUMENTS

| 5,258,958 A | * | 11/1993 | Iwahashi | G11C 16/28 365/185.11 |
| 6,078,530 A | * | 6/2000 | Choi | G11C 11/22 365/189.09 |
| 2015/0035032 A1 | * | 2/2015 | Kang | G11C 7/18 257/295 |

FOREIGN PATENT DOCUMENTS

| CN | 101064182 B | * | 5/2010 | G11C 11/16 |
| EP | 0477369 A1 | * | 4/1992 | |

* cited by examiner

*Primary Examiner* — Huan Hoang
(74) *Attorney, Agent, or Firm* — TraskBritt

(57) ABSTRACT

Multi-level cells, and related methods, arrays, devices, and systems, are described. A device may include a memory array including a first reference section including a first number of memory cells and a first reference digit line. The memory array may also include a second reference section including a second number of memory cells and a second reference digit line. The memory array may also include a target section including a memory cell. The target section may further include a first digit line coupled to the memory cell via a first switch, wherein the first digit line is further coupled to the first reference digit line via a first sense amplifier. The target section may also include a second digit line coupled to the first digit line via a second switch, wherein the second digit line is further coupled to the second reference digit line via a second sense amplifier.

20 Claims, 12 Drawing Sheets

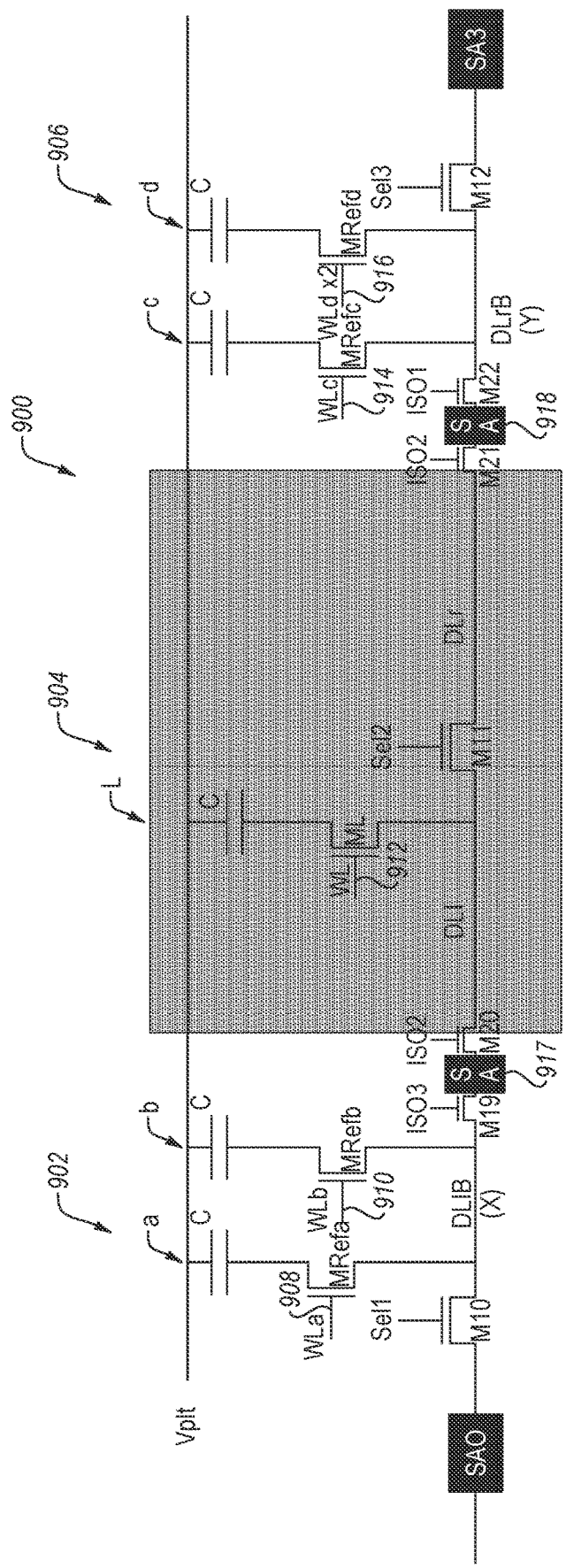
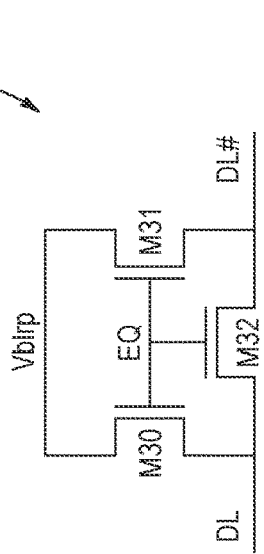
FIG. 9A
FIG. 9B

MULTI-LEVEL CELLS, AND RELATED ARRAYS, DEVICES, SYSTEMS, AND METHODS

TECHNICAL FIELD

Embodiments of the disclosure relate to multi-level cells. Yet more specifically, various embodiments of the disclosure relate to multi-level memory cells, multi-level cell memory, and associated sensing and write-back operations. Additionally, embodiments include related methods, arrays, devices, and systems.

BACKGROUND

Memory devices are typically provided as internal, semiconductor-based, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data rate memory (DDR), low-power double-data rate memory (LPDDR), phase-change memory (PCM), and Flash memory.

BRIEF DESCRIPTION OF THE DRAWINGS

FIG. 9A illustrates a portion of a memory array of another example memory device, according to various embodiments of the disclosure.

FIG. 9B depicts an example selection device, according to various embodiments of the disclosure.

DETAILED DESCRIPTION

Figure 1:
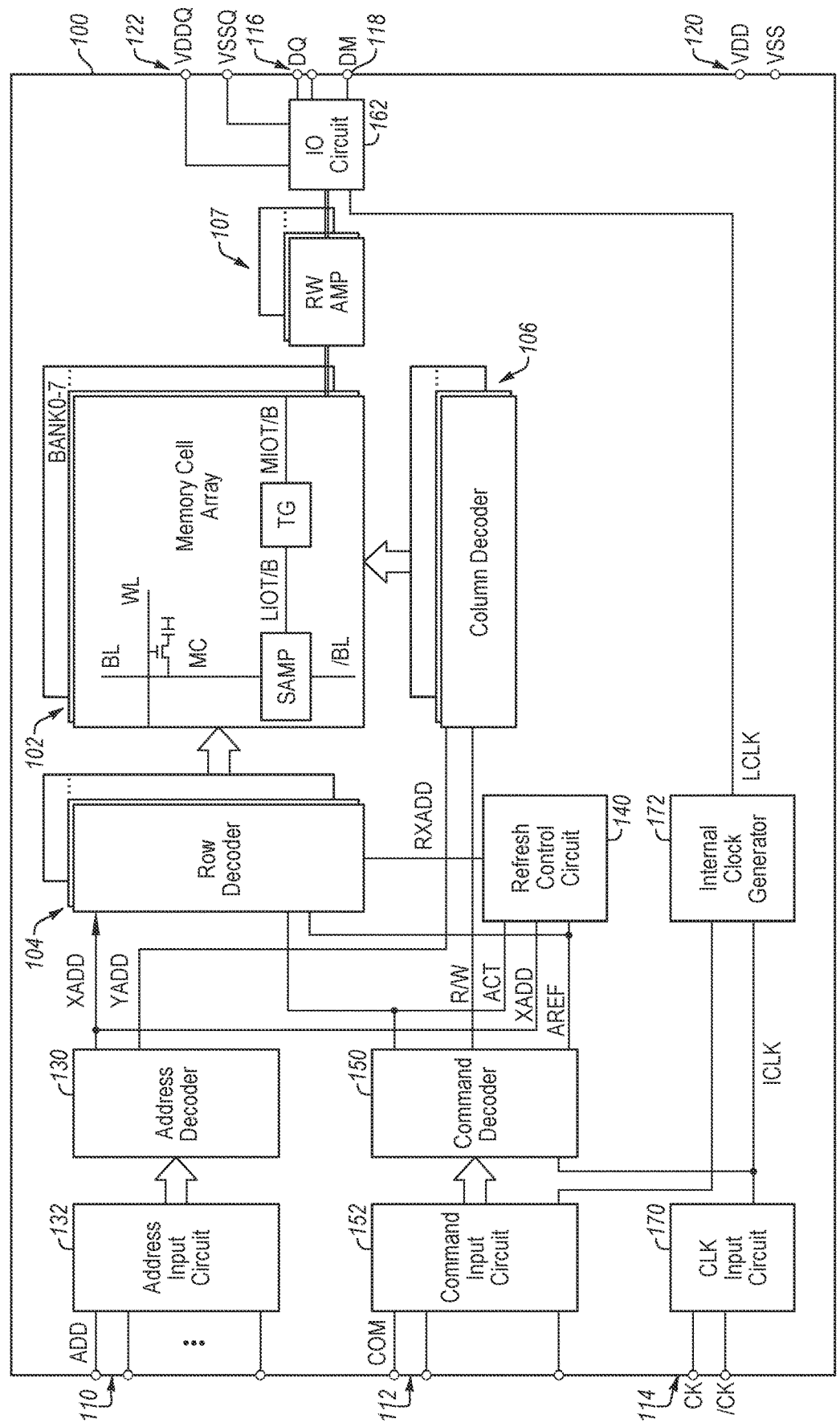
FIG. 1 is a functional block diagram of an example memory device, according to various embodiments of the present disclosure.

Memory devices are typically provided as internal storage areas in an electronic device (e.g., a computer). There are several different types of memory, one of which is known as random access memory (RAM) that is typically used as main memory in a computer environment. Most RAM is volatile, meaning it requires a periodic regeneration of stored electrical charge to maintain its contents. A dynamic random access memory (DRAM) is a type of RAM that is made up of cells wherein, typically, each cell or bit includes one transistor and one capacitor. In conventional devices, a cell may be capable of storing two states (i.e., information in the form of a "1" or "0" bit as an electrical charge on the capacitor).

As will be appreciated, while overall size of a memory device is one important metric of architectural efficiency, a second important metric is array efficiency (also commonly referred to as "storage density"). Array efficiency is determined by dividing the area consumed by functionally addressable memory bits of a memory device by the total die area of the memory device. It has proven to be difficult to improve the array efficiency of memory devices (e.g., 2D planar DRAM). Further, multi-level cell memory (e.g., tripe level cell DRAM) may require complex sense amplifier (SA) and comparator circuitry, which requires a lot of space.

As disclosed herein, various embodiments may relate to multi-level (e.g., triple level) cell memory (e.g., DRAM) architectures. Further, some embodiments relate to read schemes (also referred to herein as "sensing schemes") for multi-level cell memory architectures. More specifically, for example, in some embodiments, a voltage of a target cell of a memory array of a memory device may be sensed based on a number of (e.g., two) reference voltages (e.g., a first reference voltage and a second reference voltage). In some embodiments, the first reference voltage may be generated via a number of (e.g., two, three, four, etc.) reference cells of the memory array, and the second reference voltage may be generated via another number of (e.g., two, three, four, etc.) reference cells of the memory array. According to various embodiments, the voltage of the target cell may be sensed as a low voltage (e.g., approximately 0 volt), a medium voltage (e.g., also referred to herein as a "mid voltage") (e.g., approximately 0.5 volt), or a high voltage (e.g., approximately 1 volt).

Moreover, some embodiments relate to write schemes (also referred to herein as "write-back schemes") for multi-level (e.g., triple level) cell memory (e.g., DRAM) architectures. According to some embodiments, one of a number of voltages (e.g., 0, 0.5, or 1 volt) may be written to a cell (e.g., of a target section) of a memory array of a memory device. Further, a voltage (e.g., 0 volt) may be written to a cell of a first reference section of the memory array, and another voltage (e.g., 0.5 volt) may be written to one or more other cells of the first reference section. Moreover, a voltage (e.g., 1 volt) may be written to a cell of a second reference section of the memory array, and another voltage (e.g., 0.5 volt) may be written to one or more other cells of the second reference section.

As will be appreciated, various embodiments of the present disclosure may increase storage density of a memory array (e.g., by approximately 50%). As will also be appreciated, according to various embodiments, the storage density of a memory array may be increased without requiring complex sense amplifier or equalizer circuitry.

Although various embodiments are described herein with reference to semiconductor and/or memory devices, the present disclosure is not so limited, and the embodiments may be generally applicable to microelectronic systems and/or devices that may or may not include semiconductor devices and/or memory devices. Embodiments of the present disclosure will now be explained with reference to the accompanying drawings.

FIG. 1 is a block diagram of a memory device 100, in accordance with one or more embodiments of the present disclosure. Memory device 100 may include, for example, a DRAM (dynamic random access memory), a SDRAM (synchronous dynamic random access memory), a DDR SDRAM (double data rate DRAM), a SGRAM (synchronous graphics random access memory), LPDDR SDRAM, a graphics DDR SDRAM, content addressable memory (CAM), or any combination thereof. Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of word lines WL, a number of bit lines BL and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active signal ACT, a read/write signal R/W, and a refresh signal AREF.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Row address XADD, which may be supplied to a refresh address control circuit 140, may be a signal including multiple bits (which may be transmitted in series or in parallel) and may correspond to a specific row of a memory bank (e.g., the memory bank activated by, for example, active signal ACT).

Active signal ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL, /BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active signal ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Refresh signal AREF may include a pulse signal that is activated when a command signal COM includes an auto-refresh command. Refresh signal AREF may be supplied to refresh address control circuit 140, which is also configured to receive active signal ACT and row address XADD. Refresh address control circuit 140 is configured to provide a row address RXADD that specifies a particular word line to be refreshed. In some examples, refresh address control circuit 140 may provide row address RXADD responsive to sequential refresh commands received from an external controller (not shown in FIG. 1).

Clock signals CK and /CK may be received via clock terminals 114. A clock input circuit 170 may generate internal clock signals ICLK based on clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

According to various embodiments, memory cell array 102 may include circuitry (e.g., memory cells, digit lines, sense amplifiers, selection devices, and/or other circuitry) in accordance with various embodiments, as described more fully below.

Figure 2:
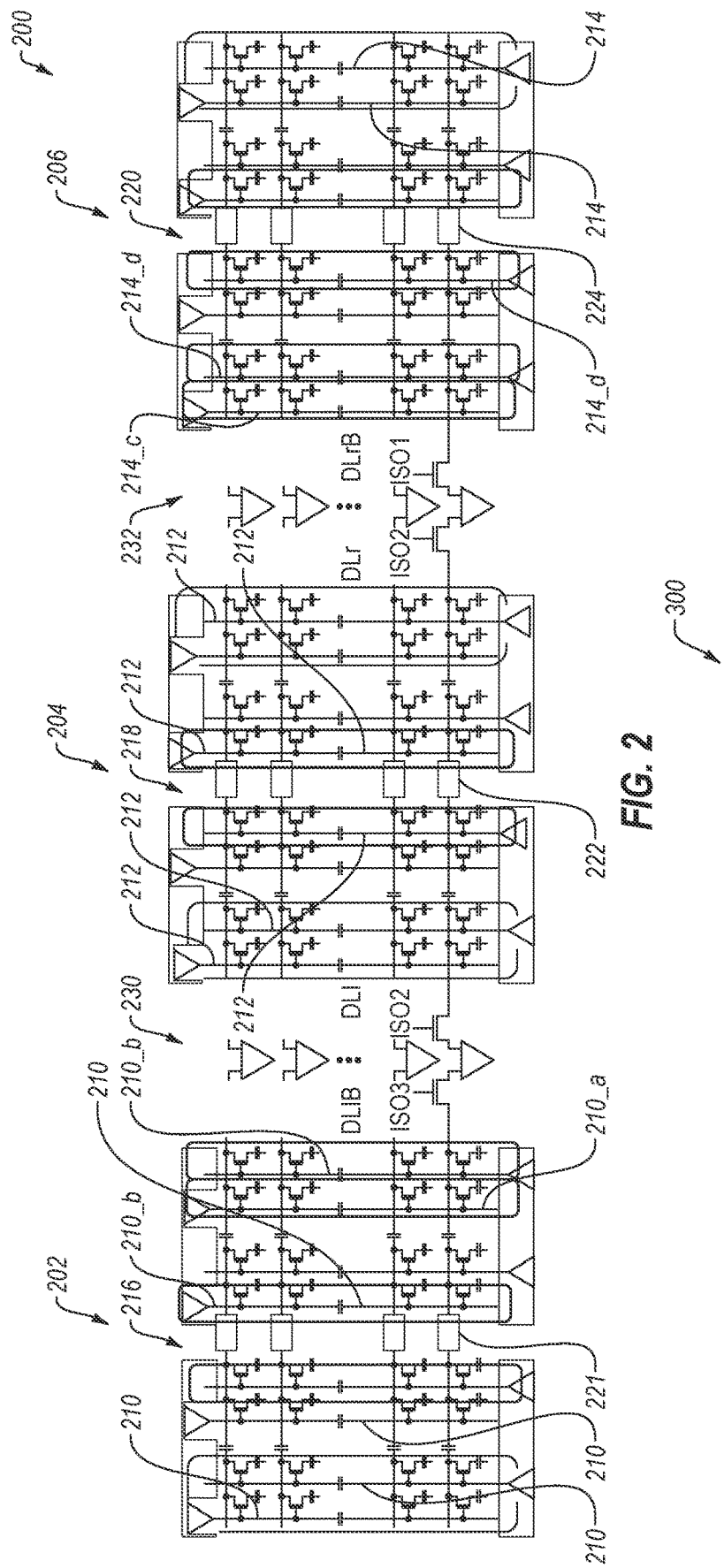
FIG. 2 depicts a portion of a memory array of an example memory device, in accordance with various embodiments of the disclosure.

FIG. 2 depicts a portion of a memory array 200 of an example memory device, in accordance with various embodiments of the disclosure. Memory array 200, which may include and/or may be part of an architecture (e.g., a memory architecture), may include a number of sections 202, 204, and 206. For example, section 204 may be referred to as a "live section," a "target section," or an "array section," and each of sections 202 and 206 may be referred to as a "reference section" or an "array section."

Each section 202, 204, and 206 includes a number of wordlines. More specifically, section 202 includes a number of wordlines 210, section 204 includes a number of wordlines 212, and section 206 includes a number of wordlines 214. In one example, section 202 includes a wordline 210_a and wordlines 210_b, and section 206 includes a wordline 214_c and wordlines 214_d. Further, section 202 includes a portion 216, section 204 includes a portion 218, and section 206 includes a portion 220. Each of portion 216, portion 218, and portion 220 may also referred to as a "middle portion," wherein each portion 216, 218, and 220 includes a number of selectors. More specifically, for example, portion 216 includes a selector 221, portion 218 includes a selector 222, and portion 220 includes a selector 224.

Figure 3:
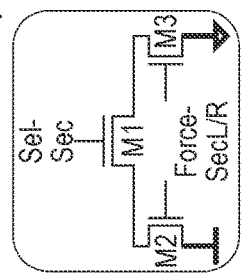
FIG. 3 illustrates an example selection device, in accordance with one or more embodiments of the disclosure.

In some embodiments, selector 221, selector 222, and/or selector 224 may include a selection device 300, as shown in FIG. 3. With reference to FIG. 3, selection device 300 includes a transistor M1, a transistor M2, and a transistor M3. For example, transistor M1, may include an NMOS transistor (also referred to as an "NMOS selector") and transistors M2 and M3, which may include NMOS transistors, may individually or collectively be referred to as a "force device."

With reference again to FIG. 2, memory array 200 further includes an isolation section 230 and an isolation section 232. Each isolation section 230 and 232 includes a number of sense amplifiers and a number of transistors (e.g., "isolation transistors"), as will be described more fully below.

Figures 4A, 4B:
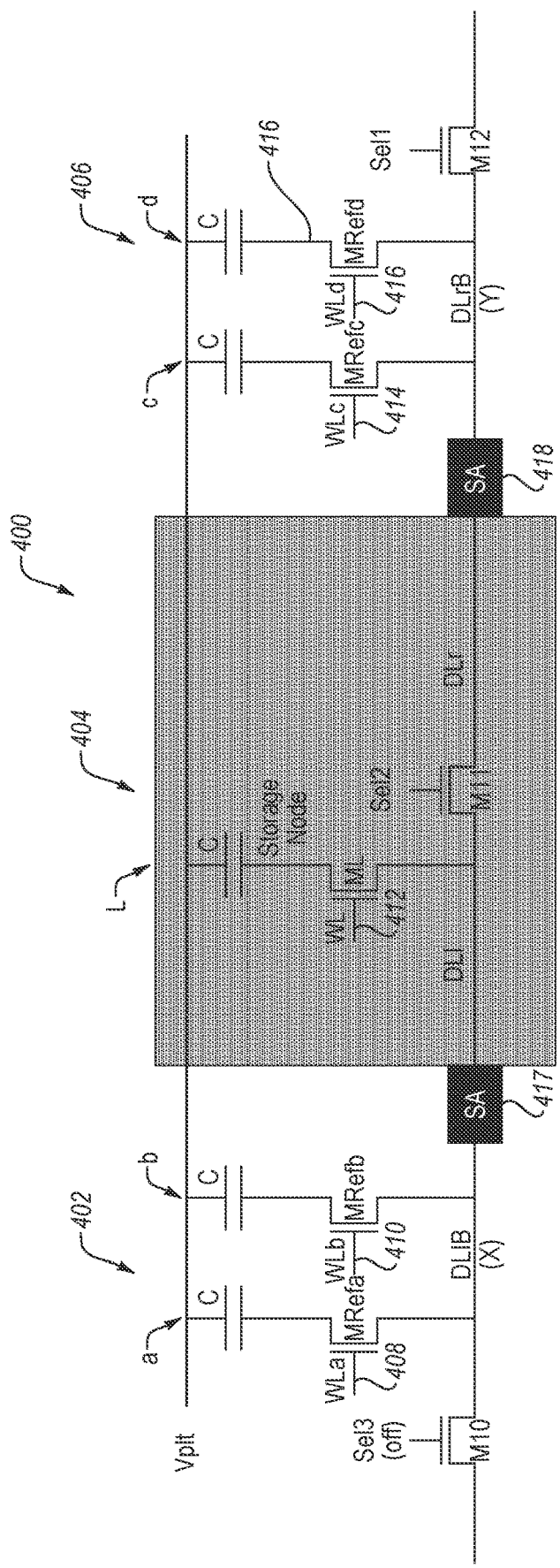
FIG. 4A illustrates a portion of a memory array of an example memory device, according to various embodiments of the disclosure.
FIG. 4B shows a table including various values associated with the memory array of FIG. 4A.

FIG. 4A depicts a portion of a memory array 400 of an example memory device, in accordance with various embodiments of the disclosure. Memory array 400, which may include and/or may be part of an architecture (e.g., a memory array architecture), may include a number of sections 402, 404, and 406. For example, section 404 may be referred to as a "live section," a "target section," or an "array section," and each of sections 402 and 406 may be referred to as a "reference section" or an "array section." Section 402 includes a memory cell a and a memory cell b, section 404 includes a memory cell L, and section 406 includes a memory cell c and a memory cell d. According to various embodiments disclosed herein, section 402 may include any suitable number of memory cells, including one or more instances of cell a and/or one or more instances of cell b, depending on a desired reference voltage to be generated via section 402. Similarly, section 406 may include any suitable number of memory cells, including one or more instances of cell c and/or one or more instances of cell d, depending on a desired reference voltage to be generated via section 406.

Section 402 includes wordlines 408 and 410, section 404 includes wordline 412, and section 406 includes wordlines 414 and 416. As illustrated, wordline 408 is also depicted as wordline WLa, wordline 410 is also depicted as wordline WLb, wordline 412 is also depicted as wordline WL, wordline 414 is also depicted as wordline WLc, and wordline 416 is also depicted as wordline WLd. Each wordline depicted in memory array 400 is coupled to a transistor, which is further coupled to a capacitor.

Memory array 400 further includes a number of selection transistors, including transistors M10, M11, and M12. Further, a sense amplifier 417 may be positioned between section 402 and section 404, and a sense amplifier 418 may be positioned between section 404 and section 406. For example, isolation section 230 (see FIG. 2) may include sense amplifier 417, and isolation section 232 (see FIG. 2) may include sense amplifier 418. As illustrated, sense amplifier 417 is coupled between a digit line DLlB (node X) (also referred to herein as a "reference line" or "reference digit line") and a digit line DLl. Further, transistor M11 is coupled between digit line DLl and a digit line DLr, and sense amplifier 418 is coupled between digit line DLr and a digit line DLrB (node Y) (also referred to herein as a "reference line" or "reference digit line").

According to some embodiments, a storage node (e.g., capacitor C) of section 404 may be configured to store one of a number of (e.g., three) voltage levels. More specifically, capacitor C of cell L may be configured to store a first voltage level (also referred to herein as a "high voltage level") (e.g., between 1 volt and 0.67 volt), a second voltage level (also referred to herein as a "mid voltage level") (e.g., between 0.67 volt and 0.33 volt), or a third voltage level (also referred to herein as a "low voltage level") (e.g., between 0.33 volt and 0 volt). Further, according to some embodiments, memory array 400 may be configured with two reference voltage levels. More specifically, section 402 may be configured to generate a first voltage and section 406 may be configured to generate a second, different (e.g., higher) voltage. Yet more specifically, in one example, section 402 may be configured to generate a voltage of approximately 0.33 volt and section 406 may be configured to generate a voltage of approximately 0.67 volt. In this example, cell a may store a voltage of approximately 0 volt and each of two instances of cell b may store a voltage of approximately 0.5 volt (i.e., 1 volt total/3 cells=0.33 volt), and cell c may store a voltage of approximately 1 volt and each of two instances of cell d may store a voltage of approximately 0.5 volt (i.e., 2 volts total/3 cells=0.67 volt). As will be appreciated, the reference voltage of a section may be adjustable based on a number of reference cells in the section used to generate the reference voltage.

FIG. 4B illustrates a table 420 depicting various values associated with memory array 400. With reference to FIGS. 4A and 4B, a contemplated sensing operation will now be described. In this example, transistor ML and transistor M11 of section 404 may be turned ON to charge digit line DLl and digit DLr (i.e., via a charge on capacitor C of section 404). Subsequently, transistor M11 is turned OFF (i.e., to isolate digit line DLl from digit DLr). Further, transistors MRefa, MRefb, MRefc, and MRefd may be turned ON to charge reference lines DLlB and DLrB (i.e., via associated capacitors of section 402 and section 406). Further, sense amplifier 417 may compare a voltage of digit line DLl to a voltage of reference line DLlB (node X), and sense amplifier 418 may compare a voltage of digit line DLr to a voltage of reference line DLrB (node Y).

In one example, if sense amplifier 417 generates a high voltage (e.g., 1 volt) on reference line DLlB (node X) and sense amplifier 418 generates a high voltage (e.g., 1 volt) on reference line DLrB (node Y), it may be determined that both digit lines DLl and DLr have a low voltage (e.g., 0 volt), and thus a voltage of cell L is low (e.g., between 0 and 0.33 volt). In another example, if sense amplifier 417 generates a low voltage (e.g., 0 volt) on reference line DLIB (node X) and sense amplifier 418 generates a low voltage (e.g., 0 volt) on reference line DLrB (node Y), it may be determined that both digit lines DLl and DLr have a high voltage (e.g., 1 volt), and thus a voltage of cell L is high (e.g., between 0.67 and 1 volt). In yet another example, if sense amplifier 417 generates a low voltage (e.g., 0 volt) on reference line DLIB (node X) and sense amplifier 418 generates a high voltage (e.g., 1 volt) on reference line DLrB (node Y), it may be determined that digit line DLl is high (e.g., 1 volt) and digit line DLr is low (e.g., 0 volt), and thus a voltage of cell L is medium (e.g., between 0.33 and 0.67 volt).

Figures 5A, 5B:
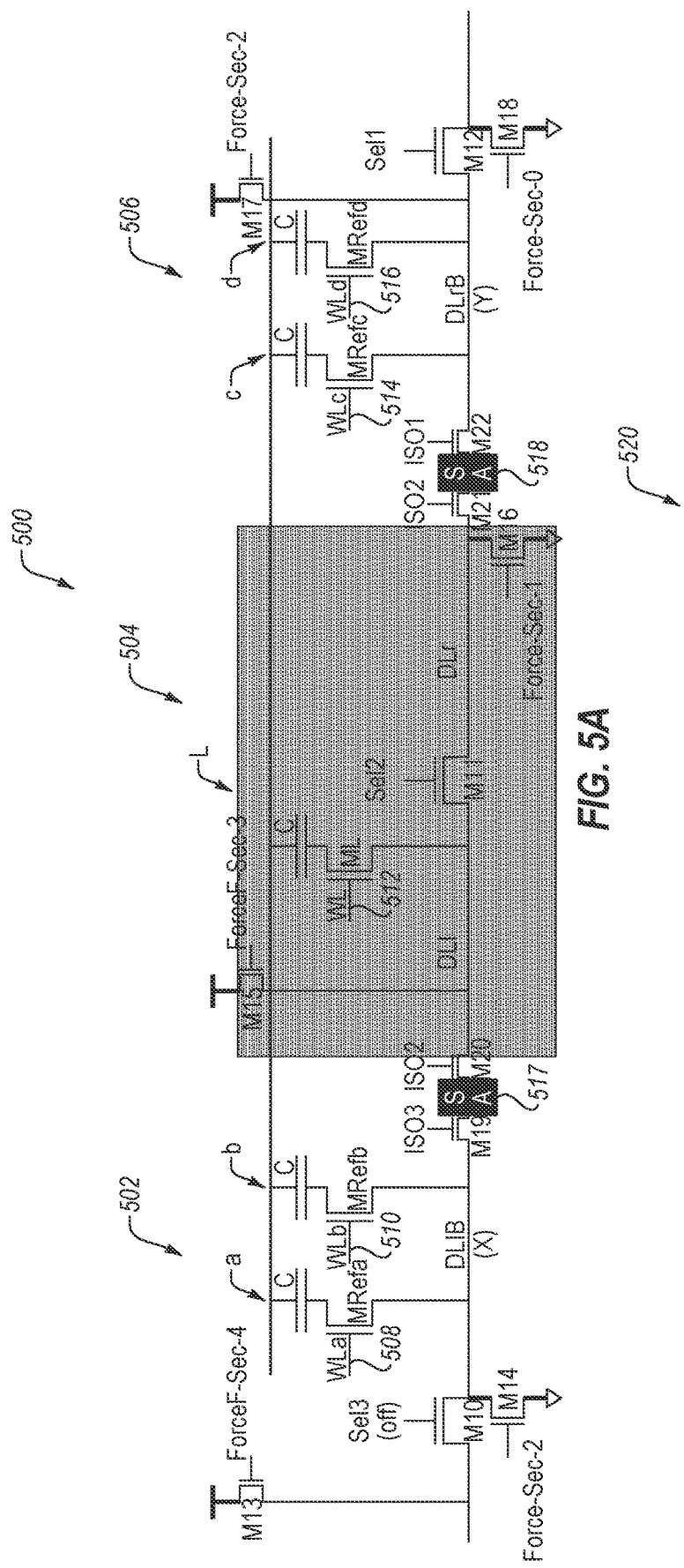
FIG. 5A illustrates a portion of a memory array of another example memory device, according to various embodiments of the disclosure.
FIG. 5B shows a table including various values associated with the memory array of FIG. 5A.

FIG. 5A depicts a portion of a memory array 500 of an example memory device, in accordance with various embodiments of the disclosure. Memory array 500, which may include and/or may be part of an architecture (e.g., a memory architecture), may include a number of sections 502, 504, and 506. For example, section 504 may be referred to as a "live section," a "target section," or an "array section," and each of sections 502 and 506 may be referred to as a "reference section" or an "array section." Section 502 includes memory cell a and memory cell b, section 504 includes memory cell L, and section 506 includes memory cell c and memory cell d.

Section 502 includes wordlines 508 and 510, section 504 includes wordline 512, and section 506 includes wordlines 514 and 516. As illustrated, wordline 508 is also depicted as wordline WLa, wordline 510 is also depicted as wordline WLb, wordline 512 is also depicted as wordline WL, wordline 514 is also depicted as wordline WLc, and wordline 516 is also depicted as wordline WLd. Further, each wordline depicted in memory array 500 is coupled to a transistor, which is further coupled to a capacitor.

Memory array 500 further includes a number of selection transistors, including transistors M10, M11, and M12. Further, a sense amplifier 517 may be positioned between section 502 and section 504, and a sense amplifier 518 may be positioned between section 504 and section 506. As illustrated, sense amplifier 517 is coupled between digit line DLIB and a digit line DLl, transistor M11 is coupled between digit line DLl and digit line DLr, and sense amplifier 518 is coupled between digit line DLr and digit line DLrB.

Additionally, memory array 500 includes a number of transistors M13-M18, wherein transistors M13, M15, and M17 are each configured to couple an associated digit line to a supply voltage, and transistors M14, M16, and M18 are each configured to couple an associated digit line to a ground voltage. Memory array 500 further includes isolation transistors M19-M22. For example, isolation section 230 (see FIG. 2) may include transistors M19 and M20 and sense amplifier 517, and isolation section 232 (see FIG. 2) may include transistors M21 and M22 and sense amplifier 518.

FIG. 5B illustrates a table 520 depicting various values associated with memory array 500. With reference to FIGS. 5A and 5B, in one example, to write a low voltage (e.g., 0 volt) to cell L, reference line DLrB and reference line DLIB may be forced high (e.g., to 1 volt) (i.e., via states of sense amplifiers 517 and 518 (e.g., determined via external supplied data)), thus causing digit lines DLl and DLr to go low. Further, transistor M11 may be turned ON to share the charge on digit lines DLl and DLr, and transistor ML may be turned on to write the low voltage to cell L.

In another example, to write a high voltage (e.g., 1 volt) to cell L, reference line DLrB and reference line DLIB may be forced low (e.g., to 0 volt) (i.e., via states of sense amplifiers 517 and 518 (e.g., determined via external supplied data)), thus causing digit lines DLl and DLr to go high. Further, transistor M11 may be turned ON to share the charge on digit lines DLl and DLr, and transistor ML may be turned on to write the high voltage to cell L.

In yet another example, to write a medium voltage (e.g., 0.5 volt) to cell L, reference line DLrB may be forced high (e.g., to 1 volt) (i.e., via a state of sense amplifier 518 (e.g., determined via external supplied data)) and reference line DLIB may be forced low (e.g., to volt) (i.e., via a state of sense amplifier 517 (e.g., determined via external supplied data)), thus causing digit line DLl to be high and digit line DLr to be low. Further, transistor M11 may be turned ON to share the charge on digit lines DLl and DLr (i.e., (1+0)/2=0.5), and transistor ML may be turned on to write the medium voltage to cell L.

Figures 6A, 6B:
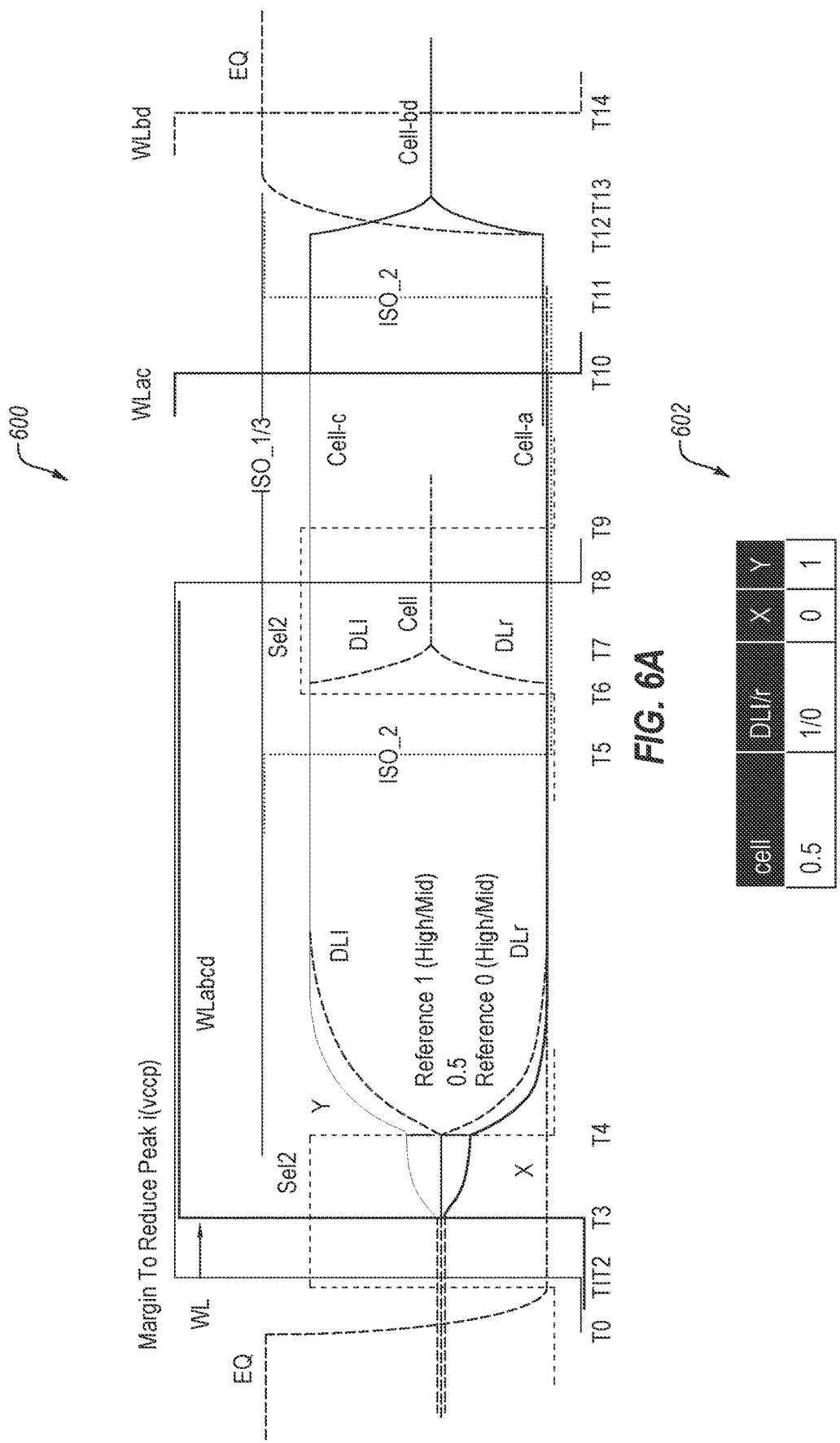
FIG. 6A is a plot depicting a number of waveforms associated with an example memory array, in accordance with various embodiments of the disclosure.
FIG. 6B shows a table including various values associated with the plot of FIG. 6A.

FIG. 6A is a plot 600 depicting a number of waveforms associated with memory array 500 of FIG. 5A, in accordance with various embodiments of the disclosure. FIG. 6B illustrates a table 602 depicting various values associated with memory array 500 of FIG. 5A. With reference to FIGS. 5A, 6A, and 6B, a contemplated operation will now be described. At least a portion of this operation includes writing a mid-voltage (e.g., 0.5 volt) to a target cell (e.g., cell L).

In this example, at a time T0, an equalizer signal EQ begins to transistor low, at a time T1, signal Sel2 transitions high (i.e., to turn ON transistor M11), and at a time T2, wordline WL transitions high (i.e., to turn ON transistor ML) to charge digit lines DLl and DLr with the charge of cell L. Further, at a time T3, wordlines WLa, WLb, WLc, and WLd transition high (i.e., to turn ON associated transistors) to charge references lines DLIB (node X) and DLrB (node Y) with the charge of associated cells (i.e., cells a and b charge reference line DLIB and cells c and d charge reference line DLrB). It is noted that, in at least some embodiments, activation of wordlines WLa, WLb, WLc, and WLd may be staggered (e.g., at a number of times between time T2 and time T3) (e.g., to reduce power consumption). In this example, reference line DLIB (node X) is charged to approximately 0.33 volt, and reference line DLrB (node Y) is charged to approximately 0.67 volt. At a time T4, signal Sel2 transitions low (i.e., to turn OFF transistor M11) and sense amplifiers 517 and 518 sense data. More specifically, for example, sense amplifier 517 compares the voltage on reference line DLIB to the voltage on digit line DLl and sense amplifier 518 compares the voltage on reference line DLrB to the voltage on digit line DLr. In this example, reference line DLIB transitions low (e.g., to a low voltage, such as 0 volt), reference line DLrB transitions high (e.g., to a high voltage, such as 1 volt), digit line DLl transitions high, and digit line DLr transitions low. Further, at a time T5, isolation signal ISO_2 transitions low (i.e., to turn OFF transistors M21 and M22), and at a time T6, signal Sel2 transitions high (i.e., to turn ON transistor M11) causing digits lines DLl and DLr to transition to a mid-voltage (e.g., 0.5 volts) at a time T7. For example, if prior to turning ON transistor M11, digit line DLl is at 1 volt and digit line DLr is at 0 volt, each of digit line DLl and digit line DLr may transition to 0.5 volt responsive to transistor M11 being turned on (i.e., (1 volt+0 volt)/2=0.5 volt). Further, because transistor ML is ON, the mid-voltage (e.g., 0.5 volt) may be stored in capacitor C of section 504.

At a time T8, wordline WL transitions low to turn OFF transistor ML. Moreover, at a time T9, signal Sel2 transitions low (i.e., to turn OFF transistor M11), and at a time T10, wordlines WLa and WLc transition low (i.e., with cell a precharged to 0 volt and cell c precharged to 1 volt), and at a time T11, isolation signal ISO_2 transitions high (i.e., to turn ON transistors M20 and M21). Further, while isolation signals ISO_1 and ISO_3 remain high, at around a time T12, equalizer signal EQ begins to transistor high and, at a time T13, digit lines DLI and DLr and reference lines DLIB and DLrB are precharged to the mid-voltage (e.g., 0.5 volt). At a time T14, wordlines WLb and WLd transition low (i.e., to turn OFF transistors MRefb and MRefd) to precharge cells b and d to the mid-voltage (e.g., 0.5 volt).

Figures 7A, 7B:
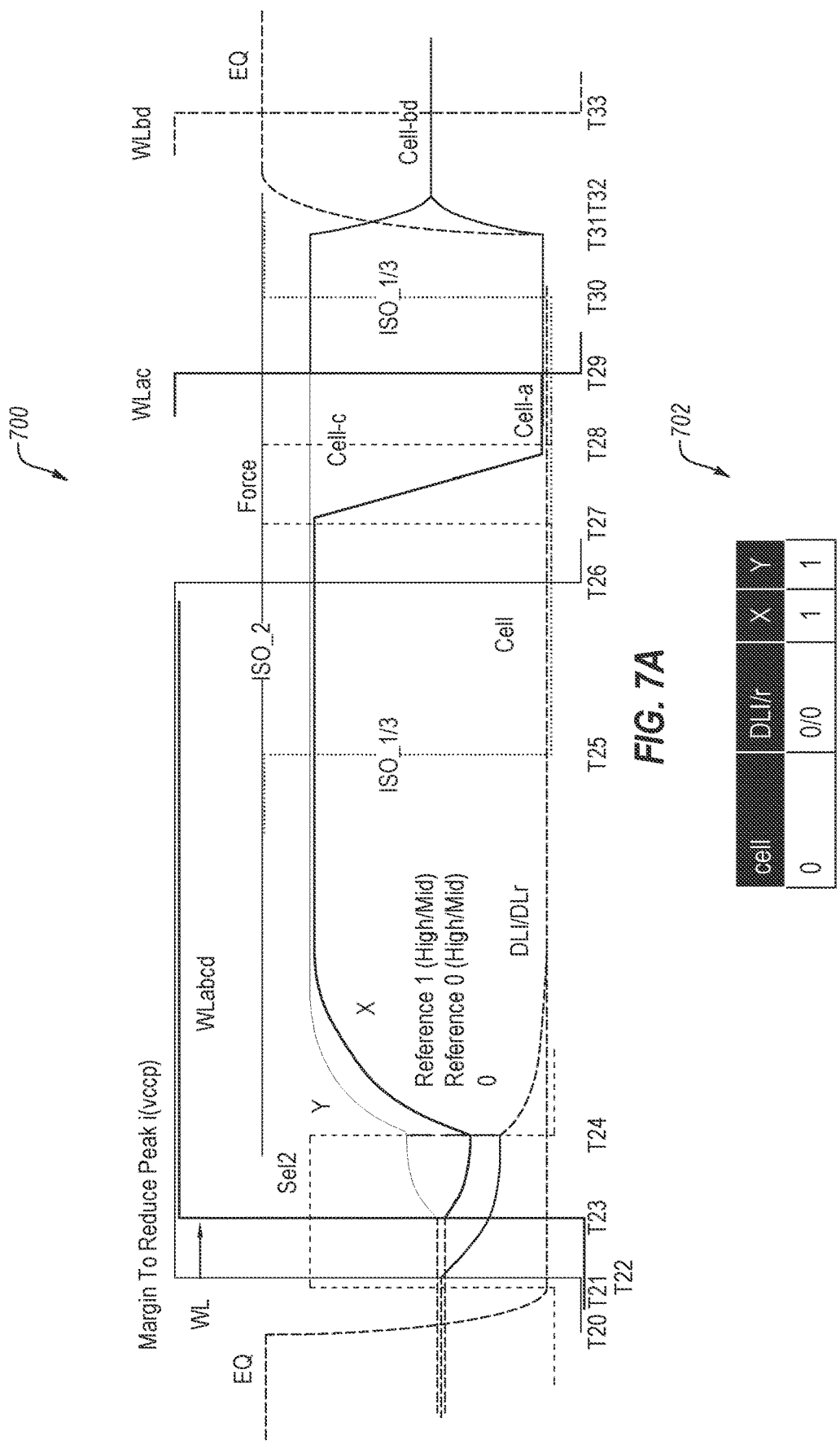
FIG. 7A is another plot depicting a number of waveforms associated with an example memory array, in accordance with various embodiments of the disclosure.
FIG. 7B shows a table including various values associated with the plot of FIG. 7A.

FIG. 7A is a plot 700 depicting a number of waveforms associated with memory array 500 of FIG. 5A, in accordance with various embodiments of the disclosure. FIG. 7B illustrates a table 702 depicting various values associated with memory array 500 of FIG. 5A. With reference to FIGS. 5A, 7A, and 7B, another contemplated operation will now be described. At least a portion of this operation includes writing a low voltage (e.g., 0 volt) to a target cell (e.g., cell L of section 504).

In this example, at a time T20, equalizer signal EQ begins to transistor low, at a time T21, signal Sel2 transitions high (i.e., to turn ON transistor M11), and at a time T22, wordline WL transitions high (i.e., to turn ON transistor ML) to charge digit lines DLI and DLr with the charge of cell L. Further, at a time T23, wordlines WLa, WLb, WLc, and WLd transition high (i.e., to turn ON associated transistors) to charge references lines DLIB (node X) and DLrB (node Y) with the charge of associated cells (i.e., cells a and b charge reference line DLIB and cells c and d charge reference line DLrB). In this example, a voltage on reference line DLIB (node X) decreases, and a voltage on reference line DLrB (node Y) begins to transition high. It is noted that, in at least some embodiments, activation of wordlines WLa, WLb, WLc, and WLd may be staggered (e.g., at a number of times between time T22 and time T23). At a time T24, signal Sel2 transitions low (i.e., to turn OFF transistor M11), and sense amplifiers 517 and 518 sense data. More specifically, for example, sense amplifier 517 compares the voltage on reference line DLIB to the voltage on digit line DLI and sense amplifier 518 compares the voltage on reference line DLrB to the voltage on digit line DLr. In this example, reference line DLIB (node X) transition highs, reference line DLrB (node Y) transitions high, and digit lines DLI and DLr transition low (e.g., to 0 volt).

At a time T25, isolation signals ISO_1 and ISO_3 transition low (i.e., to turn OFF transistors M22 and M19), and at a time T26, wordline WL transitions low to turn OFF transistor ML and precharge capacitor C of section 504 to 0 volt. At a time T27, Force-Sec-2 transitions high (i.e., to turn ON transistors M14 and M17), at a time T29, wordlines WLa and WLc transition low causing cell c of section 506 to precharge to the high voltage (e.g., 1 volt) and cell a of section 502 to precharge to the low voltage (e.g., 0 volt). Further, at a time T30, isolation signals ISO_1 and ISO_3 transition high (i.e., to turn ON transistors M22 and M19), and at around a time T31, equalizer signal EQ begins to transistor high and, at a time T32, digit lines DLI and DLr and reference lines DLIB and DLrB are precharged to the mid-voltage (e.g., 0.5 volt). At a time T33, wordlines WLb and WLd transition low (i.e., to turn OFF transistors MRefb and MRefd) to precharge cell b of section 502 and cell d of section 506 to the mid-voltage (e.g., 0.5 volt).

Figures 8A, 8B:
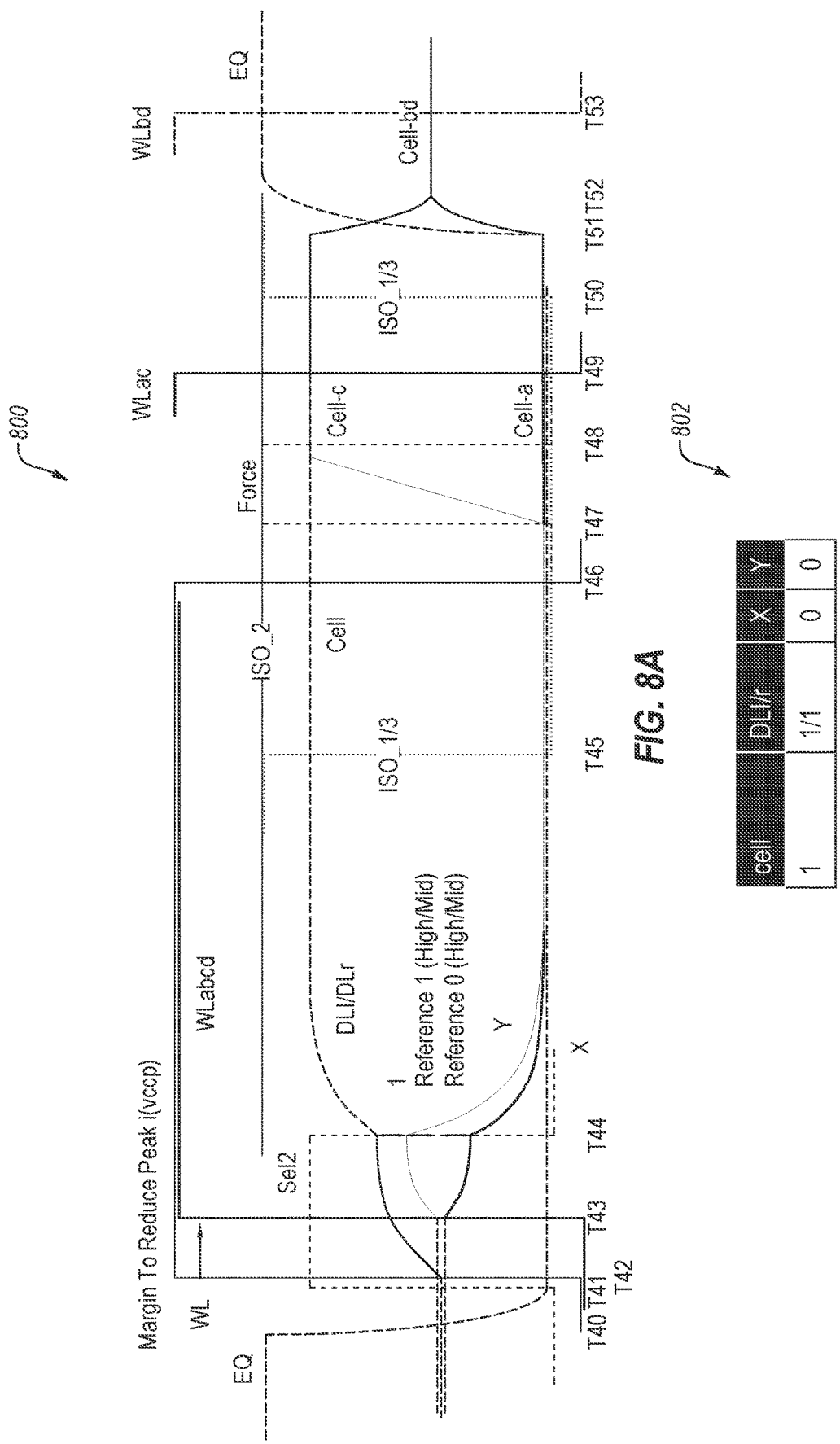
FIG. 8A is another plot depicting a number of waveforms associated with an example memory array, in accordance with various embodiments of the disclosure.
FIG. 8B shows a table including various values associated with the plot of FIG. 8A.

FIG. 8A is a plot 800 depicting a number of waveforms associated with memory array 500 of FIG. 5A, in accordance with various embodiments of the disclosure. FIG. 8B illustrates a table 802 depicting various values associated with memory array 500 of FIG. 5A. With reference to FIGS. 5A, 8A, and 8B, yet another contemplated operation will now be described. At least a portion of this operation includes writing a high voltage (e.g., 1.0 volt) to a cell (e.g., cell L).

In this example, at a time T40, equalizer signal EQ begins to transistor low, at a time T41, signal Sel2 transitions high (i.e., to turn ON transistor M11), and at a time T42, wordline WL transitions high (i.e., to turn ON transistor ML) to charge digit lines DLI and DLr with the charge of cell L. Further, at a time T43, wordlines WLa, WLb, WLc, and WLd transition high (i.e., to turn ON associated transistors) to charge references lines DLIB (node X) and DLrB (node Y) with the charge of associated cells (i.e., cells a and b charge reference line DLIB and cells c and d charge reference line DLrB). It is noted that, in at least some embodiments, activation of wordlines WLa, WLb, WLc, and WLd may be staggered (e.g., at a number of times between time T42 and time T43). In this example, a voltage on reference line DLIB (node X) decreases, and a voltage on reference line DLrB (node Y) increases. At a time T44, signal Sel2 transitions low (i.e., to turn OFF transistor M11), and sense amplifiers 517 and 518 sense data. More specifically, for example, sense amplifier 517 compares the voltage on reference line DLIB to the voltage on digit line DLI and sense amplifier 518 compares the voltage on reference line DLrB to the voltage on digit line DLr. In this example, reference line DLIB (node X) transitions low, reference line DLrB (node Y) transitions low, and digit lines DLI and DLr transition high (e.g., toward 1 volt).

At a time T45, isolation signals ISO_1 and ISO_3 transition low (i.e., to turn OFF transistors M22 and M19), and at a time T46, wordline WL transitions low to turn OFF transistor ML and precharge capacitor C of section 504 to 1 volt. At a time T47, Force-Sec-2 transitions high (i.e., to turn ON transistors M14 and M17), at a time T48, Force-Sec-2 transitions low, and at a time T49, wordlines WLa and WLc transition low causing cell c of section 506 to precharge to the high voltage (e.g., 1 volt) and cell a of section 502 to precharge to the low voltage (e.g., 0 volt). Further, at a time T50, isolation signals ISO_1 and ISO_3 transition high (i.e., to turn ON transistors M22 and M19), and at around a time T51, equalizer signal EQ begins to transistor high and, at a time T52, digit lines DLI and DLr and reference lines DLIB and DLrB are precharged to the mid-voltage (e.g., 0.5 volt). At a time T53, wordlines WLb and WLd transition low to precharge cell b of section 502 and cell d of section 506 to the mid-voltage (e.g., 0.5 volt).

FIG. 9A depicts a portion of a memory array 900 of an example memory array 900, in accordance with various embodiments of the disclosure. Memory array 900, which may include and/or may be part of an architecture (e.g., a memory architecture), may include a number of sections 902, 904, and 906. For example, section 904 may be referred to as a "live section," a "target section," or an "array section," and each of sections 902 and 906 may be referred to as a "reference section" or an "array section." Section 902 includes memory cell a and memory cell b, section 904 includes memory cell L, and section 906 includes memory cell c and memory cell d.

Section 902 includes wordlines 908 and 910, section 904 includes wordline 912, and section 906 includes wordlines 914 and 916. As illustrated, wordline 908 is also depicted as wordline WLa, wordline 910 is also depicted as wordline WLb, wordline 912 is also depicted as wordline WL, wordline 914 is also depicted as wordline WLc, and wordline 916 is also depicted as wordline WLd. Each wordline depicted in memory array 900 is coupled to an associated transistor, which is further coupled to an associated capacitor.

Memory array 900 further includes a number of selection transistors, including transistors M10, M11, and M12. Further, a sense amplifier 917 may be positioned between section 902 and section 904, and a sense amplifier 918 may be positioned between section 904 and section 906. As illustrated, sense amplifier 917 is coupled between digit line DLIB (node X) and digit line DLI, transistor M11 is coupled between digit line DLI and digit line DLr, and sense amplifier 918 is coupled between digit line DLr and digit line DLrB (node Y). Memory array 900 further includes a sense amplifier SA0 and a sense amplifier SA3.

In the embodiment shown in FIG. 9A, in contrast to the embodiments shown in FIGS. 4A and 5A, force devices may not be necessary to write back voltages to a reference cell. In the embodiments described above with reference to FIGS. 4A and 5A, when an EQ voltage is ON, a digit line and a digit line bar are at 0.5 volt. However, in the embodiment of FIG. 9A, a precharge voltage may be adjustable between a number of voltages (e.g., 1 volt, 0.5 volt, and 0 volt). Therefore, in the embodiment of FIG. 9A, when an EQ voltage is ON, a digit line and a digit line bar may be at either a high voltage (e.g., 1 volt), a medium voltage (e.g., 0.5 volt), or a low voltage (0 volt).

FIG. 9B illustrates a selection device 920, which is configured to charge a digit line DL and a digit line bar DL# to a precharge voltage Vblpr, which may be, for example, a high voltage (e.g., 1 volt), a medium voltage (e.g., 0.5 volt), or a low voltage (0 volt). For example, sense amplifier SA0 and/or a sense amplifier SA3 (see FIG. 9A) may include selection device 920. Thus, in the embodiments of FIG. 9A, selection device 920 and an EQ voltage in sense amplifiers SAO and SA3 may be used to charge, for example, cell a of section 902 to the low voltage and cell c of section 906 to the high voltage.

Figure 10:
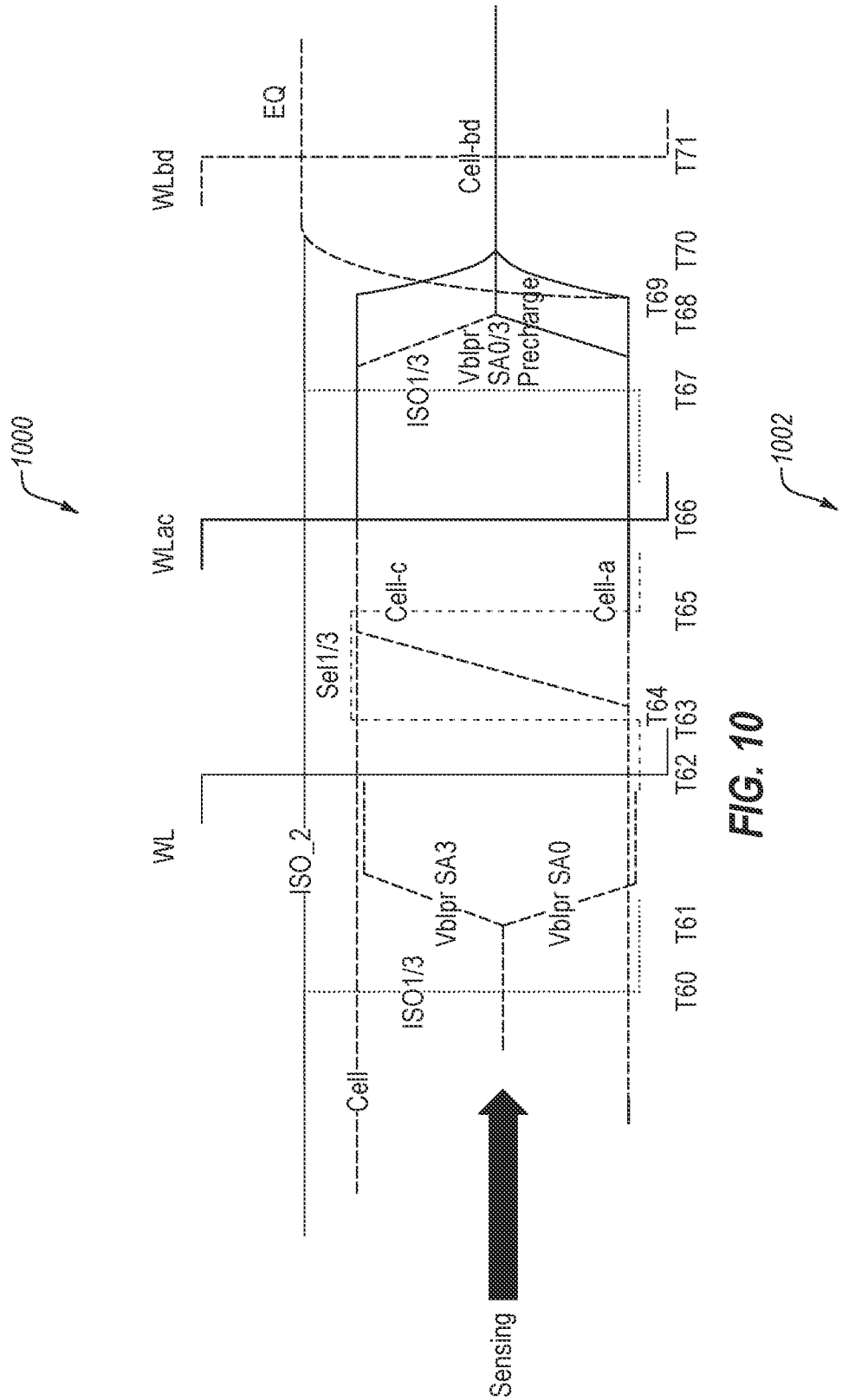
FIG. 10 is another plot depicting a number of waveforms associated with an example memory array, in accordance with various embodiments of the disclosure.

FIG. 10 is a plot 1000 depicting a number of waveforms illustrating how data may be written to cells (e.g., cells a, b, c, and d of FIG. 9A) without force devices, in accordance with various embodiments of the disclosure. With reference to FIGS. 9A and 10, a contemplated operation will now be described. It is noted that in the example shown in plot 1000, details of a sensing operation are not shown. In this example, at a time T60, isolation signals ISO_1 and ISO_3 transition low (i.e., to turn OFF transistors M22 and M19), and at a time T61, a precharge voltage Vblpr for sense amplifier SAO transitions low and a precharge voltage Vblpr for sense amplifier SA3 transitions high. At a time T62, wordline WL transitions low (i.e., to turn OFF transistor ML), and at a time T63, signals Sel1 and Sel3 transition high (i.e., to turn ON transistors M10 and M12). At a time T64, a voltage of cell c of section 906 transitions high while a voltage of cell a of section 902 remains low. At a time T65, signals Sel1 and Sel3 transition low (i.e., to turn OFF transistors M10 and M12), and at a time T66, wordlines WLa and WLc transition low such that cell a of section 902 is at a precharged level (e.g., a low voltage (e.g., 0 volt)) and cell c of section 906 is at a precharged level (e.g., a high voltage (e.g., 1.0 volt)).

Further, at a time T67, isolation signals ISO_1 and ISO_3 transition high (i.e., to turn ON transistors M22 and M19), and at a time T68, precharge voltage Vblpr for each of sense amplifier SAO and sense amplifier SA3 transition to a mid-voltage (e.g., 0.5 volt). Further, at around a time T69, equalizer signal EQ begins to transistor high and, at a time T70, digit lines DLI and DLr and reference lines DLIB (node X) and DLrB (node Y) are precharged to the mid-voltage (e.g., Vdd/2 (e.g., 0.5 volt)). At a time T71, wordlines WLb and WLd transition such that cell b of section 902 and cell d of section 906 are at the mid-voltage (e.g., 0.5 volt).

It is noted that in at least some embodiments disclosed herein, after power-up of a memory device (e.g., a memory device including a memory array (e.g., memory array 200 of FIG. 2, memory array 400 of FIG. 4A, memory array 500 of FIG. 5A, and/or memory array 900 of FIG. 9A)), data may be written to a number of cells (e.g., cell a, cell b, cell c, and/or cell d) prior to any sensing or write-back operation. Further, it is noted that, in some convention devices, N (e.g., 64) bits of data, may be stored in N (e.g., 64) cells (i.e., two state capacitor (i.e., 0 or 1 volt) for 1 bit of data). However, according to at least some embodiments disclosed herein, 1.5 bits of data may be stored per cell (e.g., three state capacitor (i.e., 0, 0.5, or 1 volt) for 1.5 bits of information), and therefore, in one example, N (e.g., 64) bits may be stored in M cells, wherein M<N. For example, according to various embodiments, 64 bits of data may be stored in 43 cells (i.e., 64/1.5=42.6, which may be rounded up to 43).

Figure 11:
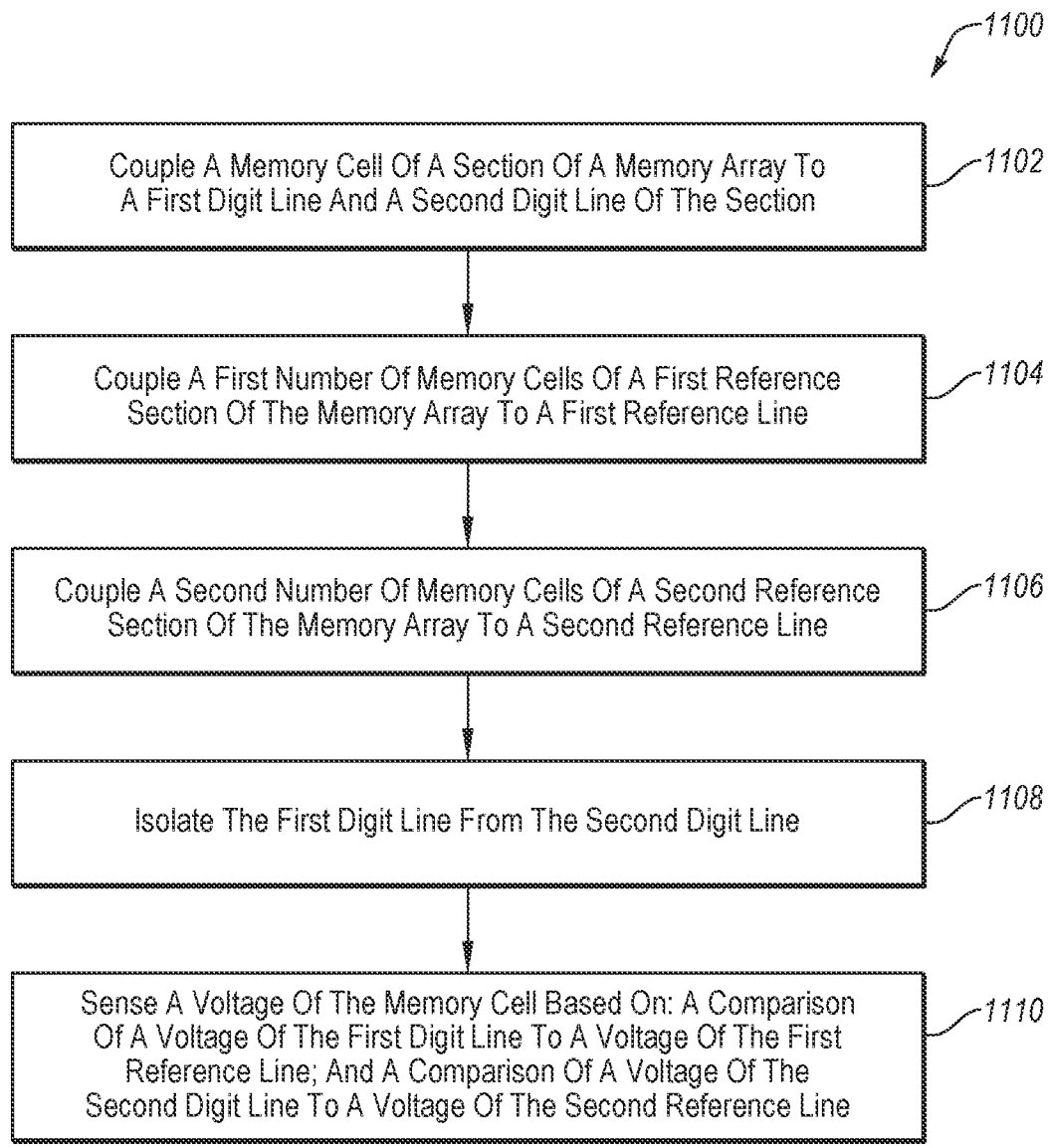
FIG. 11 is a flowchart illustrating an example method of operating a memory device, according to various embodiments of the present disclosure.

FIG. 11 is a flowchart of an example method 1100 of operating a memory device. Method 1100 may be arranged in accordance with at least one embodiment described in the present disclosure. Method 1100 may be performed, in some embodiments, by a device or system, such as memory device 100 of FIG. 1, memory array 200 of FIG. 2, memory array 400 of FIG. 4A, memory array 500 of FIG. 5A, memory array 900 of FIG. 9A, a memory system 1200 of FIG. 12, an electronic system 1300 of FIG. 13, or another device or system. Although illustrated as discrete blocks, various blocks may be divided into additional blocks, combined into fewer blocks, or eliminated, depending on the desired implementation.

Method 1100 may begin at block 1102, wherein a memory cell of a section of a memory array may be coupled to a first digit line and a second digit line of the section, and method 1100 may proceed to block 1104. For example, the memory cell may include cell L (see FIGS. 4A, 4B, and/or 9A), and the section of the memory array may include section 404 (see FIG. 4A), section 504 (see FIG. 5A), or section 904 (see FIG. 9A). Further, the first digit line may include digit line DLI and the second digit line may include digit line DLr (see FIGS. 4A, 4B, and/or 9A).

At block 1104, a first number of memory cells of a first reference section of the memory array may be coupled to a first reference line, and method 1100 may proceed to block 1106. For example, memory cell a and a number of (e.g., two) instances of memory cell b may be coupled to reference line DLIB (see FIGS. 4A, 4B, and/or 9A).

At block 1106, a second number of memory cells of a second reference section of the memory array may be coupled to a second reference line, and method 1100 may proceed to block 1108. For example, memory cell c and a number of (e.g., two) instances of memory cell d may be coupled to reference line DLrB (see FIGS. 4A, 4B, and/or 9A).

At block 1108, the first digit line may be isolated from the second digit line, and method may proceed to block 1110. For example, digit line DLI may be isolated from digit line DLr via turning OFF transistor M11.

At block 1110, a voltage of the memory cell may be sensed. For example, the voltage of the memory cell may be sensed based on a comparison of a voltage of the first digit line to a voltage of the first reference line, and a comparison of a voltage of the second digit line to a voltage of the second reference line. For example, a first sense amplifier (e.g., sense amplifier 517) may compare the voltage of the first digit line to the voltage of the first reference line, and a second sense amplifier (e.g., sense amplifier 518) may compare the voltage of the second digit line to the voltage of the second reference line.

Modifications, additions, or omissions may be made to method 1100 without departing from the scope of the present disclosure. For example, the operations of method 1100 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, method 1100 may include coupling the first digit line to the second digit line prior to coupling the memory cell of the section to the first digit line and the second digit line.

A memory system is also disclosed. The memory system may include a number of memory devices. Each memory device may include one or more arrays (e.g., memory arrays) and one or more output drivers, as described herein.

Figure 12:
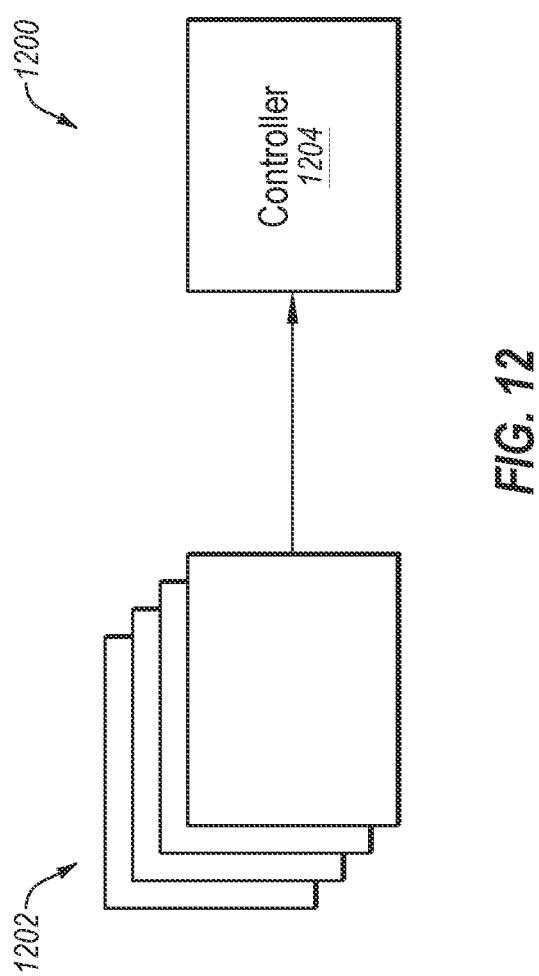
FIG. 12 is a simplified block diagram of an example memory system, according to one or more embodiments of the present disclosure.

FIG. 12 is a simplified block diagram of a memory system 1200 implemented according to one or more embodiments described herein. Memory system 1200 includes a number of memory devices 1202 and a controller 1204. For example, one or more of memory devices 1202 may include one or more memory arrays, as described herein.

Figure 13:
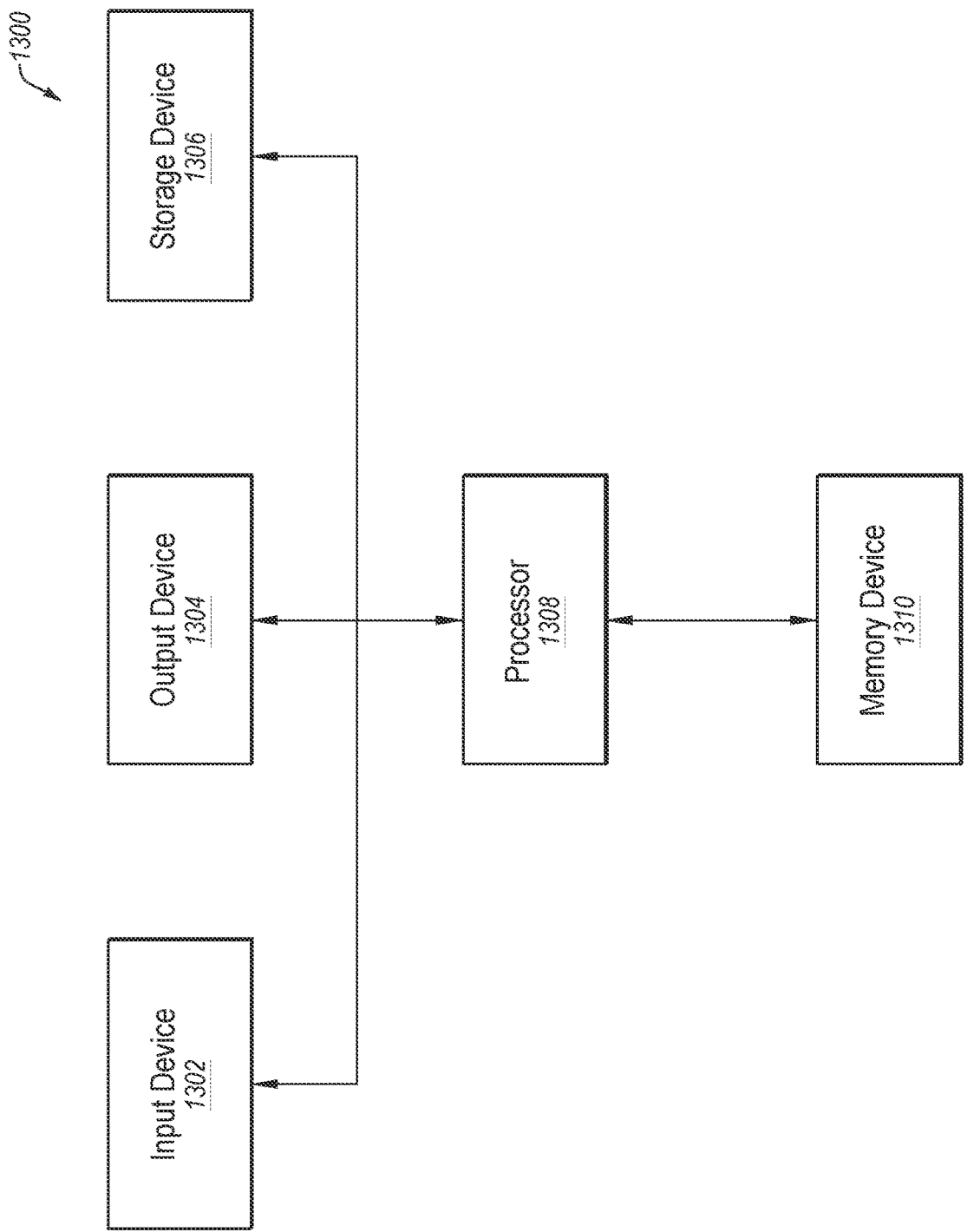
FIG. 13 is a simplified block diagram of an example electronic system, in accordance with one or more embodiments of the present disclosure.

An electronic system is also disclosed. The electronic system may include a memory system including a number of memory devices. FIG. 13 is a simplified block diagram of an electronic system 1300 implemented according to one or more embodiments described herein. Electronic system 1300 includes at least one input device 1302. Input device 1302 may be a keyboard, a mouse, or a touch screen. Electronic system 1300 further includes at least one output device 1304. Output device 1304 may be a monitor, touch screen, or speaker. Input device 1302 and output device 1304 are not necessarily separable from one another. Electronic system 1300 further includes a storage device 1306. Input device 1302, output device 1304, and storage device 1306 are coupled to a processor 1308.

Electronic system 1300 further includes a memory system 1310 coupled to processor 1308. Memory system 1310, which may include memory system 1200 of FIG. 12, includes a number of memory devices (e.g., memory device 100 of FIG. 1). Electronic system 1300 may include a computing, processing, industrial, or consumer product. For example, without limitation, electronic system 1300 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

One or more embodiments of the present disclosure include a device. The device may include a memory array including a first reference section including a first number of memory cells and a first reference digit line. The memory array may also include a second reference section including a second number of memory cells and a second reference digit line. The memory array may also include a target section including a memory cell. The target section may further include a first digit line coupled to the memory cell via a first switch, wherein the first digit line is further coupled to the first reference digit line via a first sense amplifier. The target section may also include a second digit line coupled to the first digit line via a second switch, wherein the second digit line is further coupled to the second reference digit line via a second sense amplifier.

Other embodiments of the present disclosure include a method. The method may include coupling a memory cell of a section of a memory array to a first digit line and a second digit line of the section. The method may also include coupling a first number of memory cells of a first reference section of the memory array to a first reference line. Further, the method may include coupling a second number of memory cells of a second reference section of the memory array to a second reference line. The method may also include isolating the first digit line from the second digit line. Further, the method may include sensing a voltage of the memory cell based on: a comparison of a voltage of the first digit line to a voltage of the first reference line; and a comparison of a voltage of the second digit line to a voltage of the second reference line.

Additional embodiments of the present disclosure include a system. The system may include at least one input device, at least one output device, at least one processor device operably coupled to the input device and the output device; and at least one memory system operably coupled to the at least one processor device. The memory system may include a memory device. The memory device may include a first array section configured to generate a first reference voltage on a first reference line. The memory device may further include a second array section configured to generate a second, higher reference voltage on a second reference line. Further, the memory device may include a target array section coupled between the first array section and the second array section. The target array section may include a memory cell, a first bit line coupled to the memory cell via a first switch, and a second bit line coupled to the first bit line via a second switch. The memory device may also include a first sense amplifier coupled to each of the first reference line and the first bit line. The memory device may further include a second sense amplifier coupled to each of the second reference line and the second bit line.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
a memory array comprising:
a first reference section including a first number of memory cells switchably coupled to a first reference digit line;
a second reference section including a second number of memory cells switchably coupled to a second reference digit line; and
a target section comprising:
a memory cell;
a first digit line coupled to the memory cell via a first switch, the first digit line further coupled to the first reference digit line via a first sense amplifier; and
a second digit line coupled to the first digit line via a second, different switch,
the second digit line further coupled to:
the memory cell via the first switch and the second, different switch; and
the second reference digit line via a second sense amplifier;
wherein at least one of the first reference section, the second reference section, or the target section includes at least one dedicated wordline for accessing an associated memory cell.

2. The device of claim 1, wherein the first reference section is configured to generate a low voltage on the first reference digit line and the second reference section is configured to generate high voltage on the second reference digit line.

3. The device of claim 1, wherein:
the first reference digit line is coupled to a ground voltage via a third switch; and
the second reference digit line is coupled to a supply voltage via a fourth switch.

4. The device of claim 1, further comprising:
a third sense amplifier coupled to the first reference digit line via a third switch; and
a fourth sense amplifier coupled to the second reference digit line via a fourth switch.

5. The device of claim 1, further comprising:
a third switch coupled between the first digit line and the first sense amplifier;
a fourth switch coupled between the first sense amplifier and the first reference digit line;
a fifth switch coupled between the second digit line and the second sense amplifier; and
a sixth switch coupled between the second sense amplifier and the second reference digit line.

6. A device, comprising:
a memory array comprising:
a first reference section including a first number of memory cells switchably coupled to a first reference digit line;
a second reference section including a second number of memory cells switchably coupled to a second reference digit line; and
a target section comprising:
a memory cell;
a first digit line coupled to the memory cell via a first switch, the first digit line further coupled to the first reference digit line via a first sense amplifier; and
a second digit line coupled to the first digit line via a second switch, the second digit line further coupled to the second reference digit line via a second sense amplifier,
wherein the first reference section includes a first cell coupled to a first wordline, and a second cell and a third cell coupled to a second wordline; and
wherein the second reference section includes a fourth cell coupled to a third wordline, and a fifth cell and a sixth cell coupled to a fourth wordline.

7. A method, comprising:
coupling a memory cell of a section of a memory array to a first digit line and a second digit line of the section;
coupling a first number of memory cells of a first reference section of the memory array to a first reference line;
coupling a second number of memory cells of a second reference section of the memory array to a second reference line;
isolating the first digit line from the second digit line; and sensing a voltage of the memory cell based on: a comparison of a voltage of the first digit line to a voltage of the first reference line; and a comparison of a voltage of the second digit line to a voltage of the second reference line.

8. The method of claim 7, further comprising coupling the first digit line to the second digit line prior to coupling the memory cell of the section to the first digit line and the second digit line.

9. The method of claim 7, wherein coupling the first number of memory cells to the first reference line comprises:
coupling a first memory cell of the first reference section having a first voltage to the first reference line; and
coupling a second memory cell and a third memory cell of the first reference section having a second, greater voltage to the first reference line.

10. The method of claim 7, wherein coupling the second number of memory cells to the second reference line comprises:
coupling a first memory cell of the second reference section having a first voltage to the second reference line; and
coupling a second memory cell and a third memory cell of the second reference section having a second, lower voltage to the second reference line.

11. The method of claim 7, wherein sensing the voltage of the memory cell comprises:
comparing, via a first sense amplifier, a voltage of the first digit line to a voltage of the first reference line to determine if the voltage of the first digit line is greater than the voltage of the first reference line; and
comparing, via a second sense amplifier, a voltage the second digit line to the voltage of the second reference line to determine if the voltage of the second digit line is less than the voltage of the second reference line.

12. The method of claim 7, further comprising:
determining that the voltage of the memory cell is a first voltage level responsive to determining that the voltage of the memory cell is less than the voltage of the first reference line;
determining that the voltage of the memory cell is a second voltage level responsive to determining that the voltage of the memory cell is greater than the voltage of the first reference line and less than the voltage of the second reference line; and
determining that the voltage of the memory cell is a third voltage level responsive to determining that the voltage of the memory cell is greater than the voltage of the second reference line.

13. The method of claim 7, further comprising writing one of a first voltage, a second voltage, or a third voltage to the memory cell.

14. The method of claim 13, wherein writing one of the first voltage, the second voltage, or the third voltage to the memory cell comprises one of charging a capacitor of the memory cell with a voltage of one of 0 volt, 0.5 volt, or 1 volt.

15. The method of claim 7, further comprising:
writing a first voltage to at least one memory cell of the number of memory cells of the first reference section; and
writing a second voltage to at least one other memory cell of the number of memory cells of the first reference section.

16. The method of claim 15, further comprising:
writing the second voltage to at least one memory cell of the number of memory cells of the second reference section; and
writing a third voltage to at least one other memory cell of the number of memory cells of the second reference section.

17. A system, comprising:
at least one input device;
at least one output device;
at least one processor device operably coupled to the input device and the output device; and
at least one memory system operably coupled to the at least one processor device, the memory system comprising:
a memory device comprising:
a first array section configured to generate a first reference voltage on a first reference line via switchably coupling at least one memory cell of the first array section to the first reference line;
a second array section configured to generate a second, higher reference voltage on a second reference line via switchably coupling at least one memory cell of the second array section to the second reference line;
a target array section coupled between the first array section and the second array section, the target array section comprising:
a memory cell;
a first bit line coupled to the memory cell via a first switch;
a second bit line coupled to the first bit line via a second, different switch and the memory cell via the first switch and the second, different switch;
a first sense amplifier coupled between the first reference line and the first bit line; and
a second sense amplifier coupled between the second reference line and the second bit line;
wherein at least one of the first array section, the second array section, or the target array section includes at least one dedicated wordline for accessing an associated memory cell.

18. The system of claim 17, wherein the first array section is configured to generate, via at least three memory cells, a voltage of approximately 0.33 volt on the first reference line.

19. The system of claim 17, wherein the second array section is configured to generate, via at least three memory cells, a voltage of approximately 0.67 volt on the second reference line.

20. The system of claim 17, wherein:
the first reference line is switchably coupled to a ground voltage; and
the second reference line is switchably coupled to a supply voltage.

* * * * *

UNITED STATES PATENT AND TRADEMARK OFFICE
CERTIFICATE OF CORRECTION

PATENT NO.        : 12,159,682 B2
APPLICATION NO.   : 17/805090
DATED             : December 3, 2024
INVENTOR(S)       : Jiyun Li and Yuan He Page 1 of 1

It is certified that error appears in the above-identified patent and that said Letters Patent is hereby corrected as shown below:

In the Specification
Column 8, Line 10, change "low (e.g., to volt)" to --low (e.g., to 0 volt)--

Signed and Sealed this
Fourth Day of March, 2025

Coke Morgan Stewart
*Acting Director of the United States Patent and Trademark Office*